United States Patent
Yanagisawa et al.

(10) Patent No.: US 6,316,369 B1
(45) Date of Patent: Nov. 13, 2001

(54) CORROSION-RESISTANT SYSTEM AND METHOD FOR A PLASMA ETCHING APPARATUS

(75) Inventors: Michihiko Yanagisawa; Shinya Iida, both of Ayase; Yasuhiro Horiike, Houya, all of (JP)

(73) Assignee: Speedfam Co., Ltd, Kanagawa-Pref. (JP)

( * ) Notice: Subject to any disclaimer, the term of this patent is extended or adjusted under 35 U.S.C. 154(b) by 0 days.

(21) Appl. No.: 09/539,114

(22) Filed: Mar. 30, 2000

Related U.S. Application Data (62) Division of application No. 09/109,651, filed on Jul. 2, 1998.

(30) Foreign Application Priority Data

Sep. 4, 1997 (JP) .................................................. 9-256075

(51) Int. Cl.$^7$ .................................................. H01L 21/00
(52) U.S. Cl. ............................ 438/726; 156/345; 216/69; 438/729
(58) Field of Search .................................. 438/9, 14, 710, 438/726–732; 216/59, 67, 69, 70; 156/345 V, 345 MT, 345 P, 345 MN, 345 ME, 345 MG (56) References Cited

U.S. PATENT DOCUMENTS

| | | | |
|---|---|---|---|
| 3,323,947 | * 6/1967 | Kahng et al. | 216/69 X |
| 4,891,118 | 1/1990 | Ooiwa et al. | 204/298 |
| 5,034,086 | 7/1991 | Sato | 156/345 |
| 5,160,397 | 11/1992 | Doki et al. | 156/345 |
| 5,376,224 | 12/1994 | Zarowin | 156/643 |
| 5,395,453 | 3/1995 | Noda | 118/723 R |
| 5,498,308 | * 3/1996 | Kamarehi et al. | 216/69 X |
| 5,750,208 | * 5/1998 | Mihara | 216/69 X |
| 5,785,807 | 7/1998 | Kanai et al. | 156/662.1 |
| 5,827,435 | 10/1998 | Samukawa | 216/69 |
| 5,936,352 | 8/1999 | Samukawa et al. | 315/111 |
| 5,948,485 | 9/1999 | Amano et al. | 427/571 |

FOREIGN PATENT DOCUMENTS 6-5571 1/1994 (JP) .

* cited by examiner

Primary Examiner—William A. Powell
(74) Attorney, Agent, or Firm—Fitch, Even, Tabin & Flannery (57) ABSTRACT

A corrosion-resistant system and method for a plasma etching apparatus are provided which are capable of reducing a corrosion or erosion phenomenon of a discharge tube, equipment and/or elements in a chamber of the plasma etching apparatus which is used for localized etching. A micro wave M is oscillated from a micro wave oscillator 20 toward a mixed gas of $CF_4$ and $O_2$ in a quartz discharge tube 110 to thereby produce plasma discharge. The micro wave oscillator 20 is controlled in an on-off manner by means of a pulse generator 21, to thereby oscillate a pulsed micro wave M. As a result, it is possible to reduce the erosion of the quartz discharge tube 110 caused by an active species gas G generated by the plasma discharge. Preferably, a corrosion-resistant oil A is filled in the chamber 100 for preventing an X-Y drive mechanism 130, etc., therein from being corroded or eroded by the active species gas G diffusing in the chamber 100.

11 Claims, 5 Drawing Sheets

CORROSION-RESISTANT SYSTEM AND METHOD FOR A PLASMA ETCHING APPARATUS

This is a division of prior application Ser. No. 09/109,651, filed Jul. 2, 1998 which is hereby incorporated herein by reference in its entirety.

BACKGROUND OF THE INVENTION

1. Field of the Invention

The present invention relates to an corrosion-resistant system and method for a plasma etching apparatus in which a relatively thick portion(s) on a surface of an object to be etched are locally etched.

2. Description of the Related Art

Figure 5:
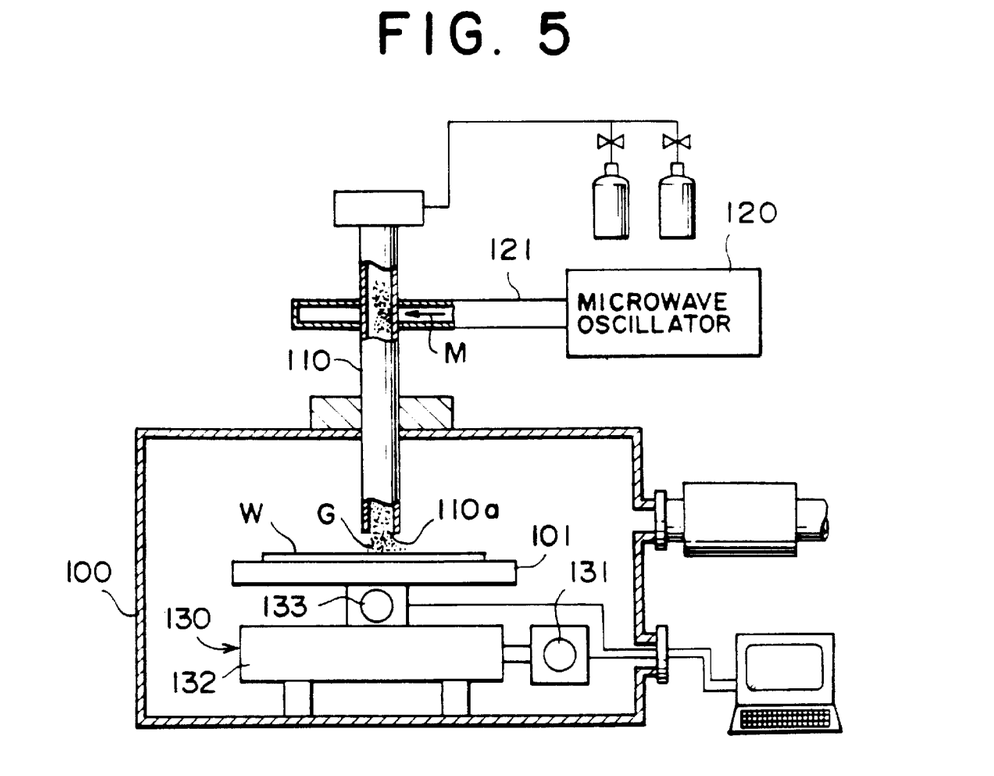
FIG. 5 is a cross sectional view showing one example of a known plasma etching apparatus.
Figure 6:
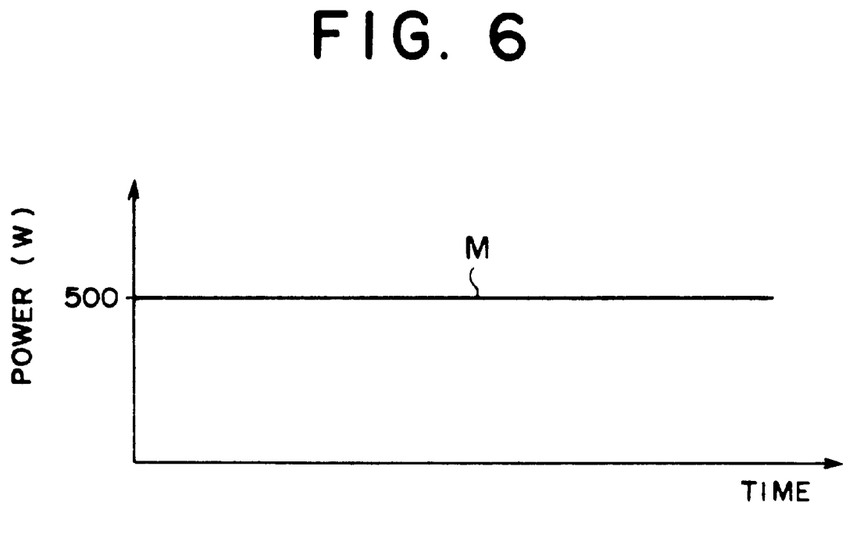
FIG. 6 is a diagrammatic view showing the oscillation state of a micro wave according to the plasma etching apparatus of FIG. 5.

FIG. 5 is a cross section showing an example of a known plasma etching apparatus, and FIG. 6 is a diagram showing the state of oscillation of a micro wave.

The plasma etching apparatus performs plasma-discharge using a micro wave. A mixed gas containing a halogen-based gas such as $CF_4$ (carbon tetrafluoride) is supplied to a quartz discharge tube 110 which is mounted on an upper surface of a chamber 100. As shown in FIG. 6, the micro wave M of about 500W is generated or oscillated continuously by a micro wave oscillator 120 toward a wave guide 121, so that the mixed gas in the quartz discharge tube 110 is made into a plasma state, thus producing active species such as fluorine radicals which contribute to etching a silicon wafer W.

On the other hand, the silicon wafer W is fixedly mounted on a stage 101 which is driven to move in an X-Y direction (i.e., the right and left direction as well as the front and rear direction of the sheet of FIG. 5) by means of an X-Y drive mechanism 130.

Specifically, a movable stand 132 carrying thereon a stage 101 is driven to move in an X-axis direction by means of a drive motor 131 and in a Y-axis direction by means of a drive motor 133 mounted on the movable stand 132.

With this construction, the active species such as fluorine radicals generated by the plasma discharge is jetted from an ejection opening 110a of a quartz discharge tube 110 onto a silicon wafer W. At the same time, the X-Y drive mechanism 130 moves a relatively thick portion of the silicon wafer W (i.e., a portion which forms a surface of the silicon wafer W is formed, and which is relatively thicker than a specified thickness) right under the ejection opening 110a of the quartz discharge tube 110 so that the relatively thick portion can be partially or locally etched.

Here, it is to be noted that during such partial or localized etching, part of the active species gas G jetted from the ejection opening 110a might diffuse to etch an inner wall of the chamber 100 as well as the X-Y drive mechanism 130.

To avoid this, the plasma etching apparatus employs an corrosion-resistant technique.

That is, the inner wall of the chamber 100 and the X-Y drive mechanism 130 are subjected to corrosion-resistant coating so that they can be prevented from being etched by the active species gas G. Furthermore, even if those portions such as threaded portions, rails, bearings of the X-Y drive mechanism 130, rotation shafts of the drive motors 131, 133 and so on, which are in sliding contact with other elements, are applied with corrosion-resistant coatings, such corrosion-resistant coatings would be liable to be peeled off during a long period of use. Thus, those contacting and sliding portions are coated with a corrosion-resistant oil which does not flake off due to repeated sliding actions.

The above-mentioned plasma etching apparatus and corrosion-resistant technique have the following problems.

A first problem is that since the plasma etching apparatus is constructed such that a micro wave M is oscillated or generated continuously so as to produce plasma discharge, as illustrated in FIG. 6, the effective period or life time of the quartz discharge tube 110 is short and the etching rate with respect to the silicon wafer W is low, and the silicon wafer W during etching is liable to be contaminated.

Figure 7:
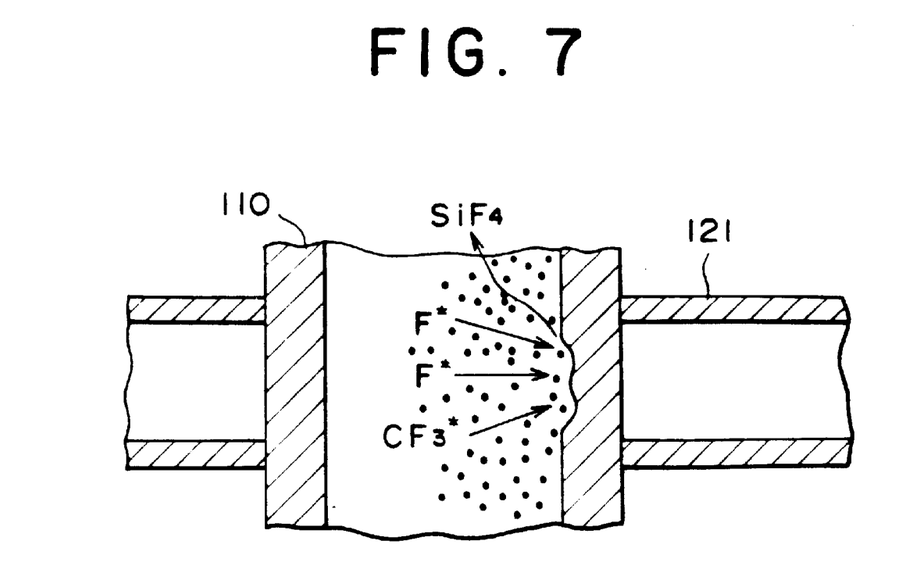
FIG. 7 is a cross sectional view showing the state of erosion of the quartz discharge tube.

FIG. 7 is a cross section showing the state of corrosion of the quartz discharge tube 110.

If a mixed gas containing a $CF_4$ (carbon tetrafluoride) gas for instance is plasma-discharged, there will be generated an active species gas G which contains $CF_3$ radicals, F radicals, $CF_3$ cations or positive ions, F anions or negative ions, etc. These radials, positive and negative ions contribute to the localized etching of the silicon wafer W.

However, when plasma discharging is continuously conducted, the quartz discharge tube 110 continuously absorbs the micro wave, resulting in a rapid rise of the heating temperature of the quartz discharge tube 110. As a consequence, the reaction of the active species gas G and a $SiO_2$ (silicon dioxide) component of the quartz discharge tube 110 is promoted, as shown in FIG. 7, so that the inner wall of the quartz discharge tube 110 is subjected to corrosion, thus forming a hole or holes through the quartz discharge tube 110 in a relatively short period of time.

Furthermore, when the corrosion of the quartz discharge tube 110 has been made, the active species gas G reacts with the quartz discharge tube 110 to turn into a $SiF_4$ (silicon tetrafluoride) gas, thereby reducing the density of the active species gas G ejected to the silicon wafer W to lower the etching rate of the silicon wafer W.

In addition, during the etching of the quartz discharge tube 110, there are generated particles of impurities contained in the quartz discharge tube 110 itself. These particles might be jetted to the surface of the silicon wafer W, thus contaminating the silicon wafer W.

A second problem is that the above-mentioned corrosion-resistant technique does not provide a satisfactory corrosion resistant effect.

Specifically, it is impossible to completely provide all the exposed portions of the chamber 100, the X-Y drive mechanism 130 and the like with corrosion-resistant coatings. Especially, the X-Y drive mechanism 130 is constructed of various members assembled, so it is impossible to coat every component member with a corrosion-resistant oil.

Further, the corrosion-resistant oil applied to the sliding portions gradually evaporates so that the base portions underlying the corrosion-resistant coatings are exposed during a long period of use. In order to avoid this, it is necessary to disassemble the chamber 100 and the X-Y drive mechanism 130 regularly or at a predetermined interval and re-coat them with the corrosion-resistant oil.

SUMMARY OF THE INVENTION

In view of the above, the present invention is intended to obviate the above-described problems, and has for its object to provide a corrosion-resistant system and a corrosion-resistant method for a plasma etching apparatus which are capable of reducing or improving the corrosion or erosion phenomena of a discharge tube of the plasma etching apparatus, other equipment or elements in a chamber used for localized etching.

In order to achieve the above object, according to a first aspect of the present invention, there is provided a corrosion-resistant system for a plasma etching apparatus in which a reactive gas in a discharge tube is plasma-discharged by using a micro wave or a high-frequency wave to produce an active species gas by means of which a relatively thick portion of an object to be etched is locally etched, the corrosion-resistant system comprising:
oscillation means for continuously oscillating the micro wave or the high frequency wave; and
oscillation control means for controlling the oscillation means in an on-off manner so that a pulsed micro wave or a pulsed high-frequency wave is oscillated from the oscillation means.

With this arrangement, the micro wave or the high-frequency wave is oscillated from the oscillation means under the control of the oscillation control means, so that a temperature rise of the discharge tube is decreased in comparison with a continuous oscillation, accordingly suppressing reactions between active species in a plasma and the discharge tube.

In a preferred form of the corrosion-resistant system for a plasma etching apparatus according to the first aspect of the invention, the duty ratio of the pulsed micro wave or high-frequency wave is set to 75% or less, and the pulse frequency of the pulsed micro wave or high-frequency wave is set to 10 kHz or more.

With this arrangement, the pulsed micro wave or high-frequency wave of the duty ratio of 75% or less is oscillated at the pulse frequency of 10 kHz or more.

In another preferred form of the corrosion-resistant system for a plasma etching apparatus according to the first aspect of the invention, the reactive gas includes a halogen-based gas.

With this arrangement, the relatively thick portion of the object to be etched is locally etched effectively by active species, while suppressing the reactions between the discharge tube and the active species of the halogen-based gas.

In a further preferred form of the corrosion-resistant system for a plasma etching apparatus according to the first aspect of the invention, the halogen-based gas comprises one selected from the group consisting of a carbon tetrafluoride gas, a sulfur hexafluoride gas, a nitrogen trifluoride gas, and a gas of other fluorocarbon substances.

With this arrangement, the relatively thick portion of the object to be etched is locally etched effectively by active species, while suppressing reactions of the discharge tube with the carbon tetrafluoride gas, the sulfur hexafluoride gas, the nitrogen trifluoride gas, and the gas of other fluorocarbon substances.

In a still further preferred form of the corrosion-resistant system for a plasma etching apparatus according to the first aspect of the invention, the discharge tube comprises one selected from the group consisting of a quartz discharge tube, a sapphire discharge tube and an alumina discharge tube.

According to a second aspect of the present invention, there is provided an corrosion-resistant method for a plasma etching apparatus in which a reactive gas in a discharge tube is plasma-discharged to produce an active species gas by means of which a relatively thick portion of an object to be etched is locally etched, the method comprising the step of producing the reactive gas by irradiating a pulsed micro wave or a high-frequency wave to the discharge tube of the plasma etching apparatus.

In a preferred form of the corrosion-resistant method for a plasma etching apparatus according to the second aspect of the invention, the duty ratio of the pulsed micro wave or high-frequency wave is set to 75% or less, and the pulse frequency of the pulsed micro wave or high-frequency wave is set to 10 kHz or more.

In another preferred form of the corrosion-resistant method for a plasma etching apparatus according to the second aspect of the invention, the reactive gas includes a halogen-based gas.

In a further preferred form of the corrosion-resistant method for a plasma etching apparatus according to the second aspect of the invention, the halogen-based gas comprises one selected from the group consisting of a carbon tetrafluoride gas, a sulfur hexafluoride gas, a nitrogen trifluoride gas, and a gas of other fluorocarbon substances.

In a still further preferred form of the corrosion-resistant method for a plasma etching apparatus according to the second aspect of the invention, the discharge tube comprises one selected from the group consisting of a quartz discharge tube, a sapphire discharge tube and an alumina discharge tube.

According to a third aspect of the present invention, there is provided an corrosion-resistant system for a plasma etching apparatus comprising:
a chamber in which an object to be etched is received;
a position control and drive mechanism provided in the chamber for placing the object at a predetermined position; and
a halogen-based gas in the chamber adapted to be plasma discharged to produce an active species gas by which the object is etched;
wherein the position control and drive mechanism is soaked in a corrosion-resistant oil which does not react with the active species gas and which is received in the chamber.

With this arrangement, since the position control and drive mechanism is soaked in the corrosion-resistant oil which does not react the active species gas, even if the diffusing active species gas flows toward the position control and drive mechanism, it is possible to prevent the position control and drive mechanism from being corroded or eroded by the active species gas.

In a preferred form of the corrosion-resistant system for a plasma etching apparatus according to the third aspect of the invention, the halogen-based gas comprises one selected from the group consisting of a carbon tetrafluoride gas, a sulfur hexafluoride gas, a nitrogen trifluoride gas and a gas of other fluorocarbon substances, and the corrosion-resistant oil comprises a perfluoropolyether oil which is resistant to fluorine.

With this arrangement, even if the fluorine-containing active species gas diffuses which comprises one selected from the group consisting of a carbon tetrafluoride gas, a sulfur hexafluoride gas, a nitrogen trifluoride gas and a gas of other fluorocarbon substances, such diffusion is blocked by the perfluoropolyether oil which is resistant to fluorine, thus preventing the position control and drive mechanism from being corroded or eroded by the fluorine-containing active species gas.

In another preferred form of the corrosion-resistant system for a plasma etching apparatus according to the third aspect of the invention, the system further comprises:
an oil passage disposed outside the chamber for circulating the corrosion-resistant oil in the chamber; and
filtering means detachably mounted on the oil passage for filtering foreign matters which are mixed in the corrosion-resistant oil.

With this arrangement, the foreign matters mixed in the circulating corrosion-resistant oil can be removed by the filtering means, so that the cleanliness of the corrosion-resistant oil can be maintained for an extended period of time.

In a further preferred form of the corrosion-resistant system for a plasma etching apparatus according to the third aspect of the invention, the system further comprises:

oil feeder means for feeding the corrosion-resistant oil to the chamber;

oil discharge means for discharging the corrosion-resistant oil from the chamber;

an oil level sensor for detecting a surface level of the corrosion-resistant oil and generating a corresponding detection signal; and first control means for controlling the oil feeder means and the oil discharge means based on the detection signal from the oil level sensor in such a manner as to maintain the surface level of the corrosion-resistant oil at a predetermined reference position.

With this arrangement, it is possible to always maintain the level or surface of the corrosion-resistant oil constant, thereby preventing such a situation that the position control and drive mechanism is exposed from the corrosion-resistant oil.

In a still further preferred form of the corrosion-resistant system for a plasma etching apparatus according to the third aspect of the invention, the system further comprises:

a pH sensor for detecting the pH of the corrosion-resistant oil and generating a corresponding detection signal: and second control means for actuating, based on the detection signal from the pH sensor, the oil discharge means when the pH of the corrosion-resistant oil turns into a value equal to or less than a predetermined reference pH value.

With this arrangement, when the pH of the corrosion-resistant oil decreases below the predetermined reference pH value, the corrosion-resistant oil is exhausted from the chamber by the oil discharge means.

In a yet further preferred form of the corrosion-resistant system for a plasma etching apparatus according to the third aspect of the invention, the system further comprises cooling means for cooling the corrosion-resistant oil to a predetermined temperature.

With this arrangement, the corrosion-resistant oil is always maintained at a predetermined temperature by virtue of the cooling means.

The above and other objects, features and advantages of the present invention will be more readily apparent from the following detailed description of preferred embodiments of the invention taken in conjunction with the accompanying drawings.

BRIEF DESCRIPTION OF THE DRAWINGS

FIGS. 2($a$) and 2($b$) are views showing the waveforms of signals from a pulse generator and a micro wave oscillator, wherein FIG. 2($a$) indicates a drive signal oscillated from the pulse generator, and FIG. 2($b$) indicates a micro wave oscillated from the micro wave oscillator;

FIGS. 3($a$) and 3($b$) are cross sectional views showing the state of a plasma generated by the pulsed micro wave, wherein FIG. 3($a$) indicates the state of the high density plasma generated upon turning on of the micro wave oscillator, and FIG. 3($b$) indicates the state of the plasma remaining upon turning off of the micro wave oscillator;

DESCRIPTION OF PREFERRED EMBODIMENTS

Now, preferred embodiments of the present invention will be described in detail with reference to the accompanying drawings.

Figure 1:
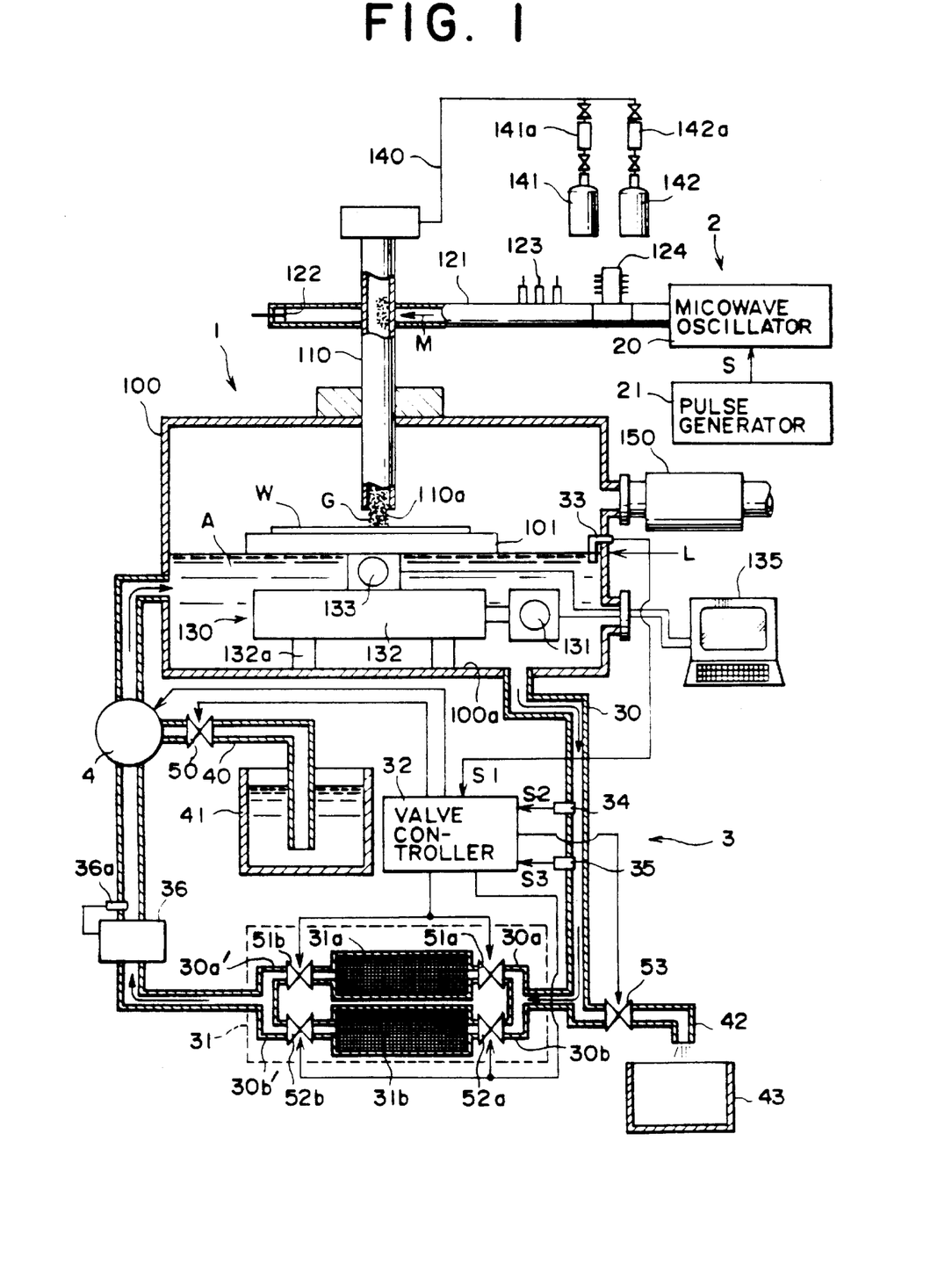
FIG. 1 is a schematic cross section showing a corrosion-resistant system for a plasma etching apparatus according to one embodiment of the present invention.

FIG. 1 schematically illustrates in cross section a corrosion-resistant system for a plasma etching apparatus constructed in accordance with a first embodiment of the present invention. The same or corresponding elements of this embodiment as those of FIG. 5 are identified with the same references or symbols.

In FIG. 1, a reference numeral 1 designates a plasma etching apparatus, and a reference numeral 2 a corrosion-resistant system according to a first aspect of the present invention. Also, a reference numeral 3 designates a corrosion-resistant system according to a third aspect of the invention.

The plasma etching apparatus 1 is substantially of the same construction as that of the plasma etching apparatus shown in FIG. 5. The plasma etching apparatus 1 includes a quartz discharge tube 110 mounted on an upper portion of a chamber 100, a wave guide 121 disposed outside of the quartz discharge tube 110, a micro wave oscillators 20 to be described later in detail for oscillating or generating a predetermined micro wave M in the wave guide 121, and an X-Y drive mechanism 130 disposed in the chamber 100.

The quartz discharge tube 110 is an elongated tubing formed of $SiO_2$ and has an ejection opening 110$a$ located inside the chamber 100.

Gas cylinders 141, 142 are connected to the quartz discharge tube 110 through supply pipes 140. A $CF_4$ gas and an $O_2$ gas are stored in the gas cylinder 141, 142, respectively. When valves in the supply tubes 140 are opened, the $CF_4$ gas and the $O_2$ gas in the gas cylinders 141, 142 are controlled in their flow rates by means of mass flow controllers 141$a$, 142$a$, respectively, and mixed with each other to form a mixed reactive gas, which is then supplied to the quartz discharge tube 110.

The wave guide 121 transmits the micro wave M generated by the micro wave oscillator 20. Inside one end (i.e., the left-hand side end in FIG. 1) of the wave guide 121, there is disposed a reflecting plate 122 in the form of a short plunger which serves to reflect the Micro wave M to thereby form a standing wave. Furthermore, disposed in the wave guide 121 are three stub tuners 123 for matching the phase of the micro wave M, and an isolator 124 which bends the reflected micro wave M transmitted to the micro wave oscillator 20 at an angle of 90° with respect to the transmission direction thereof (i.e., in the direction of the surface of FIG. 1).

On the other hand, the X-Y drive mechanism 130 comprises a movable stand 132 mounted on a rail 132$a$ on a bottom 100$a$ of the chamber 100 for sliding movement relative thereto, a drive motor 131 for driving the movable stand 132 in an X direction (i.e., in the front and rear direction of FIG. 1) along the rail 132a, and a drive motor 133 mounted on the movable stand 132 for moving the stage 101 in a Y direction (i.e., in the right and left direction of FIG. 1) while supporting the stage 101. The drive motors 131, 133 are driven to operate under the control of a computer 135.

The corrosion-resistant system 2 serves to generate a pulsed micro wave M in the wave guide 121. The corrosion-resistant system 2 has an oscillation means in the form of the micro wave oscillator 20, and an oscillation control means in the form of a pulse generator 21.

The micro wave oscillator 20 can be a well-known device which is turned on to generate a continuous micro wave M when it receives a drive signal S of the high level from the pulse generator 21. The micro wave oscillator 20 can generate the continuous micro wave M in the power range of from 100 W to 1 kW.

The pulse generator 21 generates the pulsed drive signal S for driving the micro wave oscillator 20. The pulse width and the pulse frequency of the drive signal S can be arbitrarily adjusted.

Figure 2A:
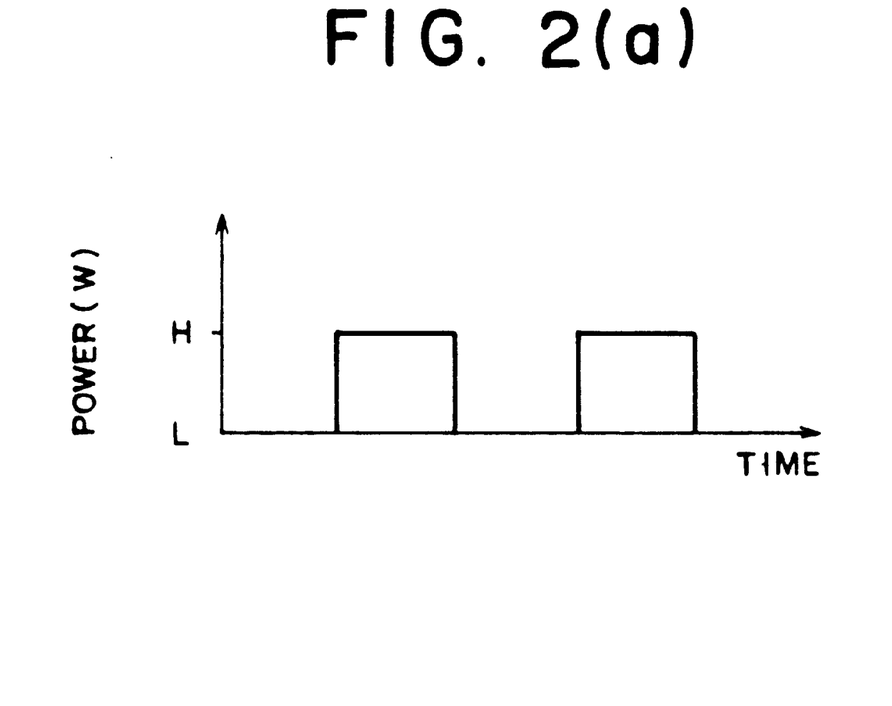
Figure 2B:
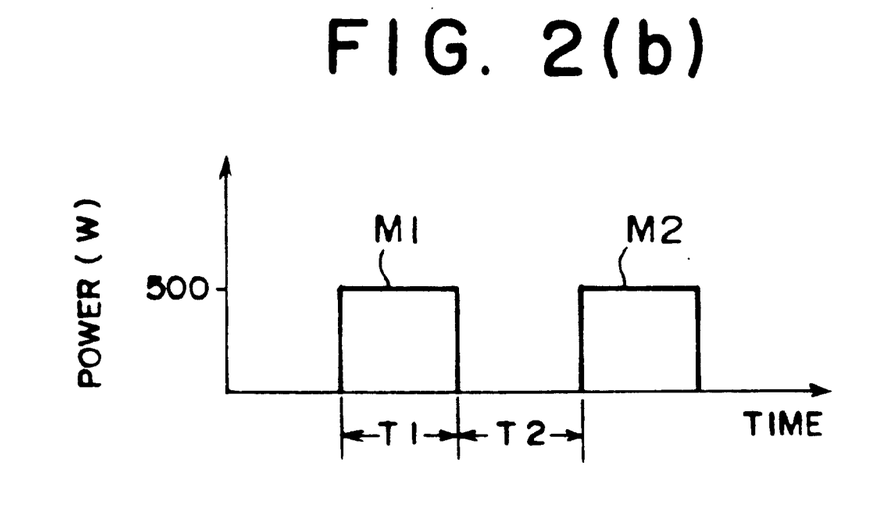

With this arrangement, when the pulsed drive signal S is input to the micro wave oscillator 20, as shown in FIG. 2(a), the micro wave oscillator 20 is turned on upon rising of a rectangular wave of the drive signal S, as shown in FIG. 2(b). On the other hand, when the drive signal S falls into the L level, the micro wave oscillator 20 is turned into an Off state. Thus, the micro wave oscillator 20 continuously oscillates the micro wave M of the power ranging from 100 W to 1 kW only for the length of time of a rectangular wave of the drive signal S. Accordingly, the micro wave oscillator 20 oscillates the pulsed micro wave M in synchronization with the drive signal S from the pulse generator 21, so that changing the pulse width and the frequency of the drive signal S can adjust the duty ratio and the pulse frequency of the micro wave M.

On the other hand, the corrosion-resistant system 3 serves to prevent the corrosion or erosion of the chamber 100 and the X-Y drive mechanism 130 which constitutes a position control and drive mechanism for controlling the position of an object to be etched. The corrosion-resistant system 3 includes a corrosion-resistant oil A in the chamber 100 in which the X-Y drive mechanism 130 is soaked or immersed, a fluid passage in the form of a circulation pipe 30 for circulation of the corrosion-resistant oil A, a filtering means 31, and a valve controller 32 to which an oil level sensor 33, a pH sensor 34, and a pressure sensor 35 are connected. The valve controller 32 constitutes a first controller and a second controller as claimed of the present invention.

The inner wall of the chamber 100 and the surface of the stage 101 are subjected to corrosion-resistant coating such as Teflon coating. The corrosion-resistant oil A is stored in the chamber 100 thus applied with the corrosion-resistant coating.

The corrosion-resistant oil A can be perfluoropolyether oil such as for example FOMBLIN made and sold by the MONTEFLUOS Company, R-95 made and sold by the ULVAC Company, or the like.

The corrosion-resistant oil A has a property to hardly react with the active species such as F radicals based on halogen-based gases. The vapor pressure of the corrosion-resistant oil A is about $10^{13}$ Torr of which the influence on the etching process can be neglected.

A pump 4 is mounted on the circulation pipe 30 for circulating the corrosion-resistant oil A through the circulation pipe 30, as indicated by an arrow in FIG. 1.

Also, the pump 4 is connected with a supply pipe 40 through which the corrosion-resistant oil A in the tank 41 is supplied to the chamber 100 when a valve 50 is opened, the valve 50 cooperating with the pump 4 to constitute an oil feeder means.

The filtering means 31 serves to filter foreign matter in the form of particles created or contained in the corrosion-resistant oil A. The filtering means 31 has two filters 31a and 31b.

Specifically, an upstream portion of the circulation pipe 30 is bifurcated into two branch pipes 30a, 30b, and a downstream of the circulation pipe 30 is also bifurcated into two branch pipes 30a', 30b'. The filter 31a is disposed between and detachably connected with the pipes 30a, 30a'. The filter 31b is disposed between and detachably connected with the pipes 30b, 30b'.

With this arrangement, when the valves 51a, 51b and the valves 52a, 52b are opened, respectively, the corrosion-resistant oil A flows in the filters 31a, 31b, respectively, where particles contained therein are filtered. In use, only one of the valves 51a, 51b or the valve 52a, 52b is put into an open state.

A discharge pipe 42 is mounted to the upstream portion of such a filtering means 31, so that the corrosion-resistant oil A is discharged or exhausted to a tank 43 through the discharge pipe 42 upon opening of an oil discharge means in the form of a valve 53.

The valve controller 32 serves to control the opening and closing of the valves 50–53 based on the detection signals from the oil level sensor 33, the pH sensor 34, and the pressure sensor 35.

Specifically, the oil level sensor 33 is mounted on a sidewall of the chamber 100 for generating a detection output signal S1 representative of the detected level or surface position of the corrosion-resistant oil A to the valve controller 32. The valve controller 32 determines, upon reception of the detection signal S1, whether the oil level indicated by the detection signal S is a reference level or position L. Then, the valve controller 32 opens the valve 53 when it is determined that the detected oil level indicated by the detection signal S1 is lower than the reference level L, and closes the valve 50 when it is determined that the detected oil level substantially matches or is equal to the reference level L. In addition, the valve controller 32 opens the valve 53 when it is determined that the detected oil level is higher than the reference level L.

There may be a case in which during etching, a slight amount of moisture or water and the active species gas G would react with each other to generate acids such as hydrofluoric acid, etc., which are then dissolved into the corrosion-resistant oil A to lower the pH thereof. If a large amount of acid is dissolved in the corrosion-resistant oil A, the respective elements of the X-Y drive mechanism 130 might be oxidized, which is undesirable. To avoid this, the pH sensor 34 is provided at the upstream portion of the filtering means 31 for detecting the pH of the corrosion-resistant oil A which flows in the circulation pipe 30. When the pH of the corrosion-resistant oil A is equal to or less than a predetermined reference pH value (e.g., pH 3), the pH sensor 34 outputs a detection signal S2 to the valve controller 32. The valve controller 32 functions to open the valve 53 while closing both the valves 51a, 51b and the valves 52a, 52b upon receipt of the detection signal S2 from the pH sensor 34, and close the valve 53 and open the valve 50 and the valves 51a, 51b (or the valves 52a, 52b) after the lapse of a predetermined time at which the corrosion-resistant oil A is expected to be completely discharged.

In the case where one in use of the filters 31a, 31b is clogged by particles admixed in the corrosion-resistant oil A, the pressure of the corrosion-resistant oil A at the upstream side of the clogged filter. The pressure sensor 35 observes or detects this pressure rise, and generates a detection signal S3 to the valve controller 32 when the pressure of the corrosion-resistant oil A rises above a predetermined pressure value. The valve controller 32 closes the now open ones of the valve 51a, 51b and valves 52a, 52b and opens the now closed ones of the valves 51a, 51b and valves 52a, 52b upon receipt of the detection signal S3 from the pressure sensor 35.

A cooling device 36 is mounted on a pipe portion at an upstream portion of the pump 4 for cooling the corrosion-resistant oil A. Specifically, the cooling device 36 observes or monitors the temperature of the corrosion-resistant oil A by means of the temperature sensor 36a mounted on the circulation pipe 30, and cools the corrosion-resistant oil A so as to prevent the vapor pressure of the corrosion-resistant oil A from being raised excessively due to a rise in the temperature thereof.

Next, the operations of the corrosion-resistant systems 2, 3 of this embodiment will be described below. Here, it is to be noted that these operations are to realize a corrosion-resistant method carried out by the plasma etching apparatus in accordance with a second aspect of the present invention.

First of all, the operation of the corrosion-resistant system 2 is described.

The $CF_4$ gas in the gas cylinder 141 and the $O_2$ gas in the gas cylinder 142 are supplied in a mixed state to the quartz discharge tube 110 with their flow rates being controlled by means of the mass flow controllers 141a, 142a.

Thereafter, the micro wave oscillator 20 is energized to oscillate a micro wave M through which the mixed gas comprising the CF gas and the $O_2$ gas is plasma-discharged. As a result, there is generated an active species gas G such as $CF_3$ radicals and F radicals which is ejected to an object to be etched in the form of a silicon wafer W from the ejection opening 110a of the quartz discharge tube 110.

Then, the X-Y drive mechanism 130 is controlled by the computer 135 to move the silicon wafer W such that the relatively thick portion on the surface of the silicon wafer W comes right under the ejection opening 110a of the quartz discharge tube 110. In this state, the relatively thick portion of the silicon wafer W is etched by the active species gas G.

At this time, the drive signal S as shown in FIG. 2(a) is input from the pulse generator 21 to the micro wave oscillator 20 to thereby generate a pulsed micro wave M, as shown in FIG. 2(b), by means of which the mixed gas in the quartz discharge tube 110 is plasma-discharged. In this case, the drive signal S of the pulse generator 21 is adjusted so as to set the duty ratio and the pulse frequency of the micro wave M to respective desired values, and at the same time, the phase of the micro wave M is adjusted by the three stub tuners 123 so that the maximum power of the micro wave M is concentrated in the quartz discharge tube 110.

Figure 3A:
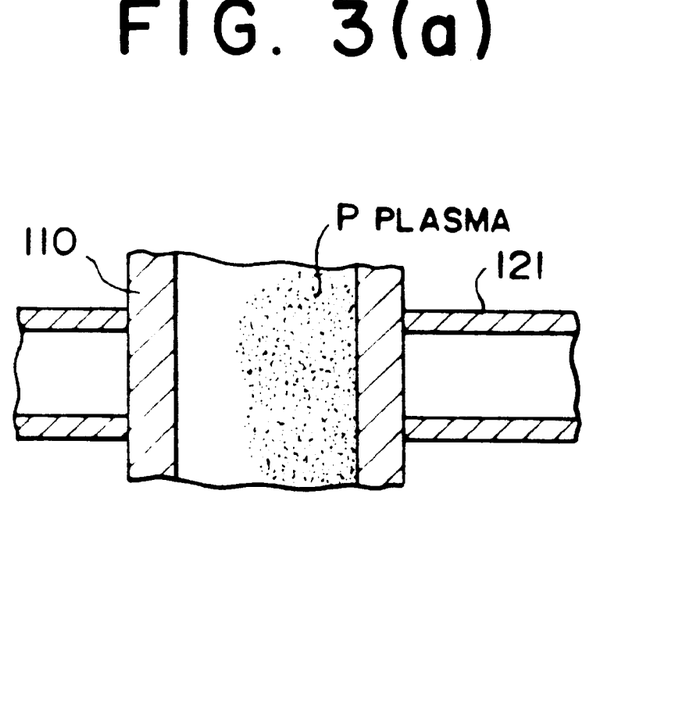
Figure 3B:
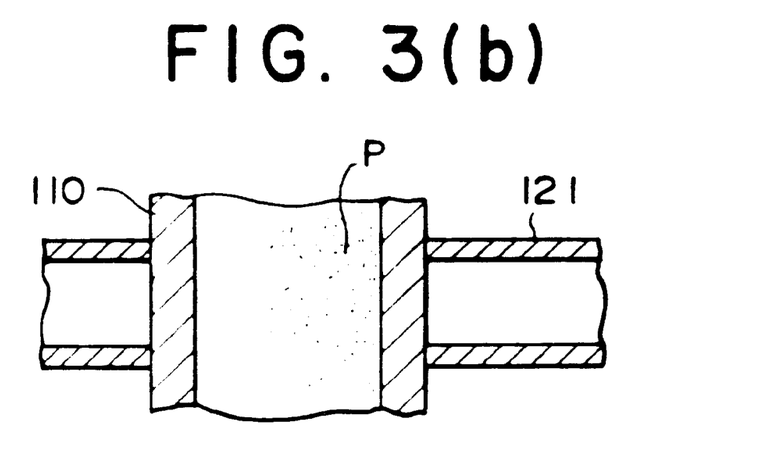

FIGS. 3(a) and 3(b) show, in cross section, the different states of the plasma generated by the pulsed micro wave M. FIG. 3(a) shows the state of a high density plasma generated upon turning on of the micro wave M, and FIG. 3(b) shows the state of the plasma remaining upon turning off of the micro wave M.

Under the conditions as set in the above manner, a pulsed micro wave M is oscillated, and upon turning on of the pulsed micro wave M, i.e., when the pulse M1 shown in FIG. 2(b) is applied to the quartz discharge pipe 110, a plasma P is generated in the quartz discharge tube 110, as shown in FIG. 3(a).

This plasma P maintains its excited state only for a period of time T1 corresponding to the width of the pulse M1, during which active species gases G such as $CF_3$ radicals, F radicals, etc., are jetted from the ejection opening 110a of the quartz discharge tube 110 toward the silicon wafer W.

Subsequently, when the oscillation of the micro wave M is stopped, the plasma-excitation action of the micro wave M is released or stopped so that the electron temperature and the plasma density decrease rapidly, but the density of the active species gas G is kept almost constant for a period of time T2.

When the following pulse M2 is applied to the quartz discharge tube 110, a plasma P shown in FIG. 3(a) is generated again.

In this manner, the plasma discharge is effected in a pulsed manner.

Figure 4:
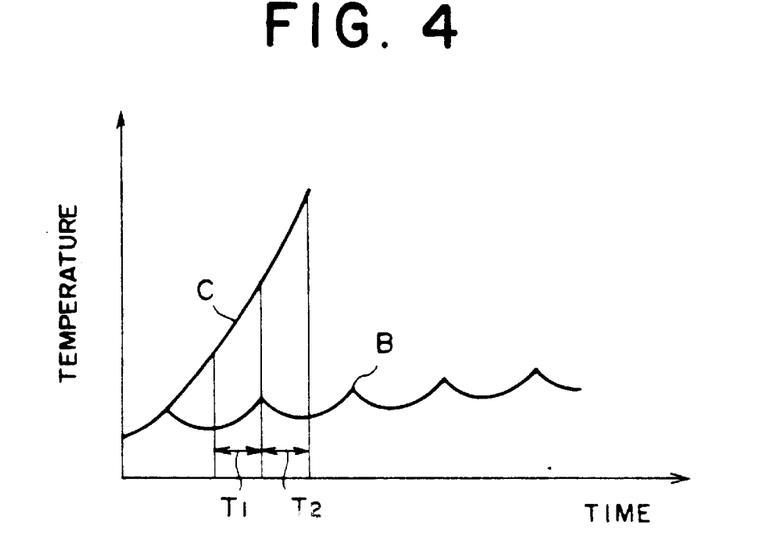
FIG. 4 is a diagrammatic view showing a temperature rise of a quartz discharge tube.

FIG. 4 diagrammatically illustrates a rise in the temperature of the quartz discharge tube 110.

With the conventional plasma etching apparatus in which a micro wave M is always oscillated continuously, the heating temperature of the quartz discharge tube 110 rises rapidly, as shown in a curve C in FIG. 4.

In contrast to this, according to this embodiment, there is a cooling period of time T2 so the heating temperature of the quartz discharge tube 110 rises and falls in a repeated manner, as indicated at a curve B in FIG. 4. Thus, the heating temperature of the quartz discharge tube 110 does not rise so much even if the apparatus is continuously used for an extended period of time.

As a consequence, the number or frequency of reactions between the active species gas G in the plasma P and the quartz discharge tube 110 is quite limited in comparison with the conventional apparatus, thus reducing the corrosion or erosion degree of the quartz discharge tube 110 due to the active species gas G and hence increasing the useful life of the quartz discharge tube 110. In addition to this, the generation of particles occurring upon erosion or corrosion of the quartz discharge tube 110 decreases sharply, too, so there will be little or no contamination of the silicon wafer W due to particles.

Furthermore, since active species reacting with the quartz discharge tube 110 decreases, the active species gas G of a desired density can be ejected to the silicon wafer W, thus making it possible to ensure a desired etching rate of the silicon wafer W.

In addition, since the micro wave oscillator 20 is turned on in an intermittent manner, it is possible to reduce the electric power consumption during oscillation of the micro wave M.

In order to demonstrate these matters, the inventors conducted the following experiment. That is, a pulsed micro wave M having an output power of about 500 W is oscillated at the duty ratio of 75% and at the pulse frequency of 10 kHz to generate an active species gas G, which is then ejected to a silicon wafer W having particles attached thereto, the number of the particles having a diameter of less than 1 $\mu$m being not greater than 100 at the original state of the silicon wafer. The corrosion-resistant time of the quartz discharge tube 110 and the number of particles attached to the silicon wafer W after the above treatment are examined.

Then, it was found that the quartz discharge tube 110 was destroyed about 70 hours later from the start, and the number of attached particles after the lapse of about 100 hours was less than 1,000.

In contrast to this, when a micro wave having an output power of about 500 W is continuously oscillated as in the conventional plasma etching apparatus, the quartz discharge tube 110 was destroyed in about 40 hours, and the number of attached particles after about 100 hours also exceeded more than a predetermined measurement limit.

In this manner, according to the corrosion-resistant system 2 of this embodiment, the corrosion-resistant period of the quartz discharge tube 110 can be increased, and the contamination of the silicon wafer W can be decreased sharply.

In order to enhance the corrosion-resistant effect of the quartz discharge tube 110, it is preferred that the time of the pulse width T1 of the micro wave M as indicated in FIG. 2(b) be short, but if it is too short, it is impossible to obtain an active species gas G of a desired density.

Moreover, a plasma P of a high density as indicated in FIG. 3(a) is produced in the quartz discharge tube 110 during the on-time or oscillation of the micro wave M, i.e., during the time T1 of the pulse width of the micro wave M as indicated in FIG. 2(b). On the other hand, the plasma P disappears when the oscillation of the micro wave M is turned off or stopped, i.e., during the period of time T2 indicated in FIG. 2(b). However, the plasma P does not disappear immediately upon turning off of the micro wave M, but there remain charged particles such as ions, electrons, etc., which constitute the plasma P, for some time. For this reason, it is considered that a plasma can be ignited readily by turning on the oscillation of the micro wave M before the charged particles disappear.

In view of such a consideration, in order to conduct plasma discharge in a smooth manner by applying a pulsed micro wave M to the interior of the quartz discharge tube 110, it is desirable to shorten the time T2 or the pulse interval as indicated in FIG. 2(b). However, too short the time T2 not only results in an increased power consumption but also in a shortened cooling time for the quartz discharge tube 110, thus making it difficult to suppress the rising of the heating temperature of the quartz discharge tube 110.

From the above, the inventors reached the following conclusion. Namely, as a result of consideration about the duty ratio and the pulse frequency of the micro wave M, which are capable of obtaining a desired density of the active species gas while enhancing the corrosion-resistant effect of the quartz discharge tube 110, as well as the duty ratio and the pulse frequency of the micro wave M, which are capable of expediting smooth plasma discharge while suppressing the rising of the heating temperature of the quartz discharge tube 110 with a limited amount of power consumption, it is preferable to employ a micro wave M having the duty ratio of not greater than 75% and the pulse frequency of not less than 10 kHz.

Next, the operation of the corrosion-resistant system 3 will be described below.

That portion of the active species gas G of a predetermined density ejected from the ejection opening 110a of the quartz discharge tube 110 which diffuses without contributing to the etching of the silicon wafer W is about to etch the inner wall oft e chamber 100 and the stage 101. However, since the inner wall of chamber 100 and the surface of the stage 101 are applied with corrosion-resistant coatings, the active species gas G is blocked by the corrosion-resistant coatings, so neither the inner wall of the chamber.100 nor the stages 101 are subjected to etching.

Furthermore, the active species gas G flowing toward the X-Y drive mechanism 130 is about to etch it due to its activity, but it is blocked from advancing toward the X-Y drive mechanism 130 by means of the corrosion-resistant oil A in which the X-Y drive mechanism 130 is immersed. Thus, the component elements of the X-Y drive mechanism 130 are prevented from being etched by the active species gas G.

Here, it is to be noted that in cases where particles are admixed in the corrosion-resistant oil A which prevents the X-Y drive mechanism 130 from being etched by the active species gas G as referred to above, the drive motors 131, 133 of the X-Y drive mechanism 130 would be caused into trouble in operation owing to the particles, thus resulting in a situation that the silicon wafer W could not be moved precisely.

To avoid such a situation, the pump 4 is driven to operate with the valves 50, 52a, 52b, 53 being closed and the valves 51a and 51b opened, so that the corrosion-resistant oil A is thereby forced to circulate through the circulation pipe 30.

With circulation of the corrosion-resistant oil A, the particles contained or mixed therein are removed by means of the filter 31a of the filtering means 31.

When a large amount of particles have been accumulated to clog the filter 31a, the pressure at the upstream side of the filter 31a, e.g., the pressure of the corrosion-resistant oil A near the pressure sensor 35 rises to reach a predetermined pressure value.

Then, a detection signal S3 is output from the pressure sensor 35 to the valve controller 32, so that the valves 51a, 51b are closed and the valves 52a, 52b are opened under the control of the valve controller 32.

As a result, the corrosion-resistant oil A circulating through the circulation pipe 30 comes to pass through the filter 31b by way of the pipe 30b. In this state, the clogged filter 31a is disconnected and removed from the pipes 30a, 30a' and replaced with a new filter 31 a which is mounted and connected between the pipes 30a and 30a', whereby it is possible to always circulate the corrosion-resistant oil A in a clean state.

When acids are generated in the corrosion-resistant oil A to lower the pH of the corrosion-resistant oil A to a value of 3 or less, a detection signal S2 is input from the pH sensor 34 to the valve controller 32, so that the valves 51a, 51b and the valves 52a, 52b are closed, and the valve 53 is opened, thereby causing the corrosion-resistant oil A to be discharged or exhausted from the discharge pipe 42 to the tank 43.

At this time, the oil level sensor 33 is maintained in an off state, so that the valve 53 is closed and the valve 52a, 52b are opened after the corrosion-resistant oil A in the chamber 100 and the circulation pipe 30 has been completely exhausted.

In this state, the oil level sensor 33 is turned on so that a detection signal S1 is output from the oil level sensor 33 to the valve controller 32, whereby the valve 50 is opened to supply a new corrosion-resistant oil A in the tank 41 to the chamber 100 through the supply pipe 40. When the level or surface position of the corrosion-resistant oil A comes to match the reference level L where the X-Y drive mechanism 130 is completely soaked or immersed in the corrosion-resistant oil A, the valve 50 is closed.

When the corrosion-resistant oil A decreases due to an extended period of use, the valve controller 32 opens the valve 50 based on a detection signal S1 from the oil level sensor 33, thereby supplying the corrosion-resistant oil A in the tank 41 to the chamber 100. As a consequence, the oil level or surface position of the corrosion-resistant oil A in the chamber 100 is always kept to the reference level When the temperature of the corrosion-resistant oil A rises due to the active species gas G of a high temperature jetted from the chamber 100, such a temperature rise is immediately detected by means of the temperature sensor 36a, whereby the corrosion-resistant oil A is cooled by means of the cooling device 36, thus restoring the temperature of the corrosion-resistant oil A to the ordinary or room temperature.

In this manner, according to the corrosion-resistant system 3, the X-Y drive mechanism 130 is subjected to corrosion-resistant treatments or coatings, and the cleanliness of the corrosion-resistant oil A is always maintained clean, and the pH value thereof is also kept substantially constant.

In order to demonstrate the above effects, the inventors conducted the following experiments.

First of all, the plasma etching apparatus 1 was operated for 23 hours without circulating the corrosion-resistant oil A, and then the chamber 100 was opened or released to the ambient atmosphere for 1 hour. Such a severe cyclic operation was carried out for 10 days in a continuous manner. After this long-run operation, the X-Y drive mechanism 130 was disassembled for examination of the level of corrosion or erosion thereof. The X-Y drive mechanism 130 was not corroded at all except for a slight change in the color of the corrosion-resistant oil A, and hence a satisfactory corrosion-resistant effect was obtained.

Subsequently, a similar operation was done while circulating the corrosion-resistant oil A. After this operation, it was found that a satisfactory corrosion-resistant effect on the X-Y drive mechanism 130 was obtained and there was no color change in the corrosion-resistant oil A. Moreover, the amount of particles in the corrosion-resistant oil A was one twentieth as compared with the case in which the corrosion-resistant oil A was not circulated.

Further, water was mixed into the corrosion-resistant oil A at the weight ratio (i.e., ratio of water to oil ) of 1%, and a similar operation was done with the exception that when the pH of the corrosion-resistant oil A decreased to a value of 3 or less, the deteriorated corrosion-resistant oil A was exchanged for a new corrosion-resistant oil under the control of the pH sensor 34 and the valve controller 32. As a result of this operation, it was found that there took place no oxidation phenomenon at all.

It should be noted that the present invention is not limited to the above-mentioned embodiments but various modifications and/or changes thereof can be made within the spirit and scope of the invention as defined in the appended claims.

For instance, in the above-mentioned embodiments, the $CF_4$ gas was used for the halogen-based gas constituting the reactive gas, but a $SF_6$ (sulfur hexafluoride) gas, a $NF_3$ (nitrogen trifluoride) gas, and other fluorocarbon substances can instead be used, while providing the same or similar corrosion-resistant effect with respect to the active species gas produced from these gases.

Furthermore, although in the above-mentioned embodiments, the plasma etching apparatus oscillating a micro wave has been described, the present invention is applicable to a variety of plasma etching apparatuses which are capable of oscillating a high-frequency wave to generate plasma discharge.

In addition, in the above-mentioned embodiments, the quartz discharge tube 110 is subjected to corrosion-resistant treatments or coatings, but every discharge tube such as a sapphire discharge tube, an alumina discharge tube, etc., which might be etched by active species gases, can be treated by corrosion-resistant coatings.

Moreover, in the above-mentioned embodiments, the corrosion-resistant coating has been applied to the inner wall of the chamber 100 and the stage 101 alone which are not soaked in the corrosion-resistant oil A, but the X-Y drive mechanism 130, the valves 50–53, etc., which are soaked in the corrosion-resistant oil A, can also be applied with corrosion-resistant coatings, thus improving the overall corrosion-resistant effect In addition, although in the above-mentioned embodiments, the perfluoropolyether oil has been used for the corrosion-resistant oil, any corrosion-resistant oil can be employed which has a vapor pressure equal to or less than $10^{-6}$ Torr, and hence the corrosion-resistant oil to be used is not limited to the perfluoropolyether oil.

As described above in detail, the present invention provides the following remarkable advantages.

According to the corrosion-resistant system and method for a plasma etching apparatus of the first and second aspects of the present invention, the discharge tube is only exposed to a plasma for a period of time corresponding to a pulse width of a micro wave or a high-frequency wave, so the temperature of the discharge tube heated by such a plasma does not rise rapidly. As a result, the corrosion or erosion of the discharge tube can be reduced, accordingly prolonging the useful life of the discharge tube.

Further, corrosion or erosion of the discharge tube caused by the active species gas, that is, reactions between the active species gas and the discharge tube decreases, accordingly preventing a decrease in the density of the active species gas. As a result, an object to be etched can be etched by a desired etching rate.

Furthermore, the reduced corrosion or erosion of the discharge tube serves to suppress the generation of particles of impurities etc., thus decreasing the contamination of an object to be etched.

In addition, the micro wave or the high-frequency wave oscillated in a pulsed manner serves to reduce the electric power consumption.

Moreover, according to the corrosion-resistant system for a plasma etching apparatus of the third aspect of the invention, the chamber and the position control and drive mechanism are covered with the corrosion-resistant coating and the corrosion-resistant oil substantially in a complete manner so as to ensure their corrosion resistance, as a consequence of which the life time of the plasma etching apparatus can be prolonged and the frequency of maintenance can be reduced.

Still further, due to the provision of the filtering means, foreign matter in the corrosion-resistant oil can be removed by the filtering means, so that the corrosion-resistant oil can always be kept clean, thus prolonging the useful life of the corrosion-resistant oil.

Furthermore, due to the provision of the oil level sensor and the first controller, the level or surface of the corrosion-resistant oil can always be maintained constant, thus preventing exposure of the position control and drive mechanism. This serves to prevent the position control and drive mechanism from being corroded or eroded by the active species gas in a reliable manner.

Further, the corrosion-resistant oil is discharged or exhausted from the chamber by an oil discharge means when the pH of the corrosion-resistant oil decreases below the predetermined reference pH value, as a consequence of which it is possible to avoid such a situation that the position control and drive mechanism would be oxidized by acids in the corrosion-resistant oil.

Finally, it is constructed such that the corrosion-resistant oil is at all times cooled and kept to a predetermined temperature by means of a cooling device. With this construction, it s possible to prevent an increase in the vapor pressure of the corrosion-resistant oil due to a temperature rise thereof, and hence resultant process contamination as well.

What is claimed is:

1. A corrosion-resistant method for a plasma etching apparatus in which a reactive gas in a discharge tube is plasma-discharged to produce an active species gas by means of which a relatively thick portion of an object to be etched is locally etched, said method comprising the step of producing said reactive gas by irradiating with a pulsed micro wave or a high-frequency wave a gas within said discharge tube of said plasma etching apparatus.

2. The corrosion-resistant method for a plasma etching apparatus according to claim 1, wherein the duty ratio of said pulsed micro wave or high-frequency wave is set to 75% or less, and wherein the pulse frequency of said pulsed micro wave or high-frequency wave is set to 10 kHz or more.

3. The corrosion-resistant method for a plasma etching apparatus according to claim 1, wherein said reactive gas includes a halogen-based gas.

4. The corrosion-resistant method for a plasma etching apparatus according to claim 3, where said halogen-based gas comprises one selected from the group consisting of a carbon tetrafluoride gas, a sulfur hexafluoride gas, a nitrogen trifluoride gas, and a gas of other fluorocarbon substances.

5. The corrosion-resistant method for a plasma etching apparatus according to claim 1, wherein said discharge tube comprises one selected from the group consisting of a quartz discharge tube, a sapphire discharge tube and an alumina discharge tube.

6. An corrosion-resistant system for a plasma etching apparatus comprising:

a chamber in which an object to be etched is received;

a position control and drive mechanism provided in said chamber for placing said object at a position; and a halogen-based gas in said chamber adapted to be plasma discharged to produce an active species gas by which said object is etched;

wherein said position control and drive mechanism is soaked in a corrosion-resistant oil which does not react with said active species gas and which is received in said chamber.

7. The corrosion-resistant system for a plasma etching apparatus according to claim 6, wherein said halogen-based gas comprises one selected from the group consisting of a carbon tetrafluoride gas, a sulfur hexafluoride gas, a nitrogen trifluoride gas and a gas of other fluorocarbon substances, and wherein said corrosion-resistant oil comprises a perfluoropolyether oil which is resistant to fluorine.

8. The corrosion-resistant system for a plasma etching apparatus according to claim 6, further comprising:

an oil passage disposed outside said chamber for circulating said corrosion-resistant oil in said chamber; and filtering means detachably mounted on said oil passage for filtering foreign matters which are mixed in said corrosion-resistant oil.

9. The corrosion-resistant system for a plasma etching apparatus according to claim 6, further comprising:

oil feeder means for feeding said corrosion-resistant oil to the chamber;

oil discharge means for discharging said corrosion-resistant from the chamber;

an oil level sensor for detecting a surface, level of said corrosion-resistant oil and generating a corresponding detection signal; and first control means for controlling said oil feeder means and said oil discharge means based on said detection signal from said oil lever sensor in such a manner as to maintain the surface level of said corrosion-resistant oil at a reference position.

10. The corrosion-resistant system for a plasma etching apparatus according to claim 9, further comprising:

a pH sensor for detecting the pH of said corrosion-resistant oil and generating a corresponding detection signal; and second control means for actuating based on the detection signal from the pH sensor, said oil discharge means when the pH of said corrosion-resistant oil turns into a value equal to or less than a reference pH value.

11. The corrosion-resistant system for a plasma etching apparatus according to claim 6, further comprising cooling means for cooling said corrosion-resistant oil.

* * * * *

UNITED STATES PATENT AND TRADEMARK OFFICE
CERTIFICATE OF CORRECTION

PATENT NO. : 6,316,369 B1
DATED : November 13, 2001
INVENTOR(S) : Yanagisawa et al.

It is certified that error appears in the above-identified patent and that said Letters Patent is hereby corrected as shown below:

Column 15,
Line 40, delete "An" and substitute -- A --.

Column 16,
Line 24, after "resistant" insert -- oil --.

Signed and Sealed this

Thirtieth Day of April, 2002

*Attest:*

JAMES E. ROGAN
*Director of the United States Patent and Trademark Office*

*Attesting Officer*